United States Patent
Yu et al.

(10) Patent No.: US 10,790,458 B2
(45) Date of Patent: Sep. 29, 2020

(54) FLEXIBLE AMOLED SUBSTRATE AND MANUFACTURING METHOD THEREOF

(71) Applicant: Wuhan China Star Optoelectronics Semiconductor Display Technology Co., Ltd., Wuhan, Hubei (CN)

(72) Inventors: Lei Yu, Hubei (CN); Songshan Li, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 295 days.

(21) Appl. No.: 15/775,535

(22) PCT Filed: Feb. 22, 2018

(86) PCT No.: PCT/CN2018/076952
§ 371 (c)(1),
(2) Date: May 11, 2018

(87) PCT Pub. No.: WO2019/140733
PCT Pub. Date: Jul. 25, 2019

(65) Prior Publication Data
US 2020/0161569 A1    May 21, 2020

(30) Foreign Application Priority Data
Jan. 19, 2018 (CN) .......................... 2018 1 0055710

(51) Int. Cl.
*H01L 51/56* (2006.01)
*H01L 51/00* (2006.01)
*H01L 27/32* (2006.01)

(52) U.S. Cl.
CPC ...... *H01L 51/0097* (2013.01); *H01L 27/3246* (2013.01); *H01L 27/3258* (2013.01); *H01L 51/56* (2013.01); *H01L 2227/323* (2013.01)

(58) Field of Classification Search
CPC ............. H01L 51/0097; H01L 27/1288; H01L 27/3258; H01L 27/3246; H01L 51/56;
(Continued)

(56) References Cited

U.S. PATENT DOCUMENTS

2017/0092708 A1    3/2017    Jeon
2018/0013095 A1    1/2018    Choi et al.

FOREIGN PATENT DOCUMENTS

CN    104934438 A    9/2015
CN    106229321 A    12/2016
(Continued)

*Primary Examiner* — Savitri Mulpuri
(74) *Attorney, Agent, or Firm* — Leong C. Lei

(57) ABSTRACT

A flexible AMOLED substrate and a manufacturing method thereof are provided. The method includes: forming a flexible backing, which includes a display section and a bending section disposed on an outer circumference of the display section; forming a buffer layer on the flexible backing, removing a portion of the buffer layer that is disposed on the bending section and preserving a portion of the buffer layer that is disposed on the display section so that an inorganic insulation layer on the bending section has a reduced thickness to improve bending resistance of the bending section of the flexible AMOLED substrate and thus improving production yield. The flexible AMOLED substrate is manufactured with the above method, in which an inorganic insulation layer included in a bending section has a reduced thickness so that the bending section of the flexible AMOLED substrate shows better resistance against bending and provides high production yield.

10 Claims, 16 Drawing Sheets

(58) Field of Classification Search
CPC ........... H01L 2227/326; H01L 27/3244; H01L 27/1218
See application file for complete search history.

(56) References Cited

FOREIGN PATENT DOCUMENTS

| | | |
|---|---|---|
| CN | 106952827 A | 7/2017 |
| CN | 107170758 A | 9/2017 |

FLEXIBLE AMOLED SUBSTRATE AND MANUFACTURING METHOD THEREOF

RELATED APPLICATIONS

The present application is a National Phase of International Application Number PCT/CN2018/076952, filed Feb. 22, 2018, and claims the priority of China Application No. 201810055710.2, filed Jan. 19, 2018.

BACKGROUND OF THE INVENTION

1. Field of the Invention

The present invention relates to the field of display technology, and more particular to a flexible AMOLED substrate and a manufacturing method thereof.

2. The Related Arts

Flat panel display devices have various advantages, such as thin device body, low power consumption, and being free of radiation and have wide applications. The flat panel display devices that are currently available include liquid crystal displays (LCDs) and organic light emitting displays (OLEDs).

OLED devices, due to advantages including being self-luminous, fully solid state, and high contrast, have become the most promising novel display devices. The best advantage of the OLED devices is being able to realize flexible displaying. The most significant direction of development of OLED devices is using a flexible backing to make a flexible display device that is light in weight, flexible, and easy to carry.

Based on the way of driving, OLEDs can be classified in two major categories, passive matrix OLED (PMOLED) and active matrix OLED (AMOLED), namely one for direct addressing, and the other for TFT array addressing, among which the AMOLED comprises pixels that are arranged in an array and belongs to an active display type, having high light emission performance and being commonly used in high definition large-sized display devices.

FIG. 1 is a schematic view illustrating a known flexible AMOLED substrate. As shown in FIG. 1, the flexible AMOLED substrate comprises a flexible backing 110. The flexible backing 110 comprises a display section and a bending section disposed along an outer circumference of the display section. The flexible backing 110 is provided with a buffer layer 120 that is located on both the display section and the bending section. Arranged in the display section, the flexible backing 110 also comprises an active layer 200 disposed on the buffer layer 120, a gate insulation layer 400 disposed on the active layer 200 and the buffer layer 120, a gate electrode 410 disposed on the gate insulation layer 400, an interlayer dielectric layer 500 disposed on the gate electrode 410 and the gate insulation layer 400, a source electrode 610 and a drain electrode 620 disposed on the interlayer dielectric layer 500, a planarization layer 700 disposed on the source electrode 610, the drain electrode 620, and the interlayer dielectric layer 500, an anode 850 disposed on the planarization layer 700, a pixel definition layer 900 disposed on the planarization layer 700 and the anode 850, and an OLED emissive layer 950 disposed on the anode 850; arranged in the bending section, the flexible backing 110 also comprises the gate insulation layer 400 disposed on the buffer layer 120, the interlayer dielectric layer 500 disposed on the gate insulation layer 400, the planarization layer 700 disposed on the interlayer dielectric layer 500, and the pixel definition layer 900 disposed on the planarization layer 700. Since the bending section of the flexible backing 110 is provided with three inorganic insulation layers including the buffer layer 120, the gate insulation layer 400, and the interlayer dielectric layer 500, the thickness of the inorganic insulation layers is relatively large so that the bending section of the flexible AMOLED substrate shows poor resistance against bending of the bending section and is easy to break and may severely affect production yield of the flexible AMOLED substrate.

SUMMARY OF THE INVENTION

Objectives of the present invention are to provide a manufacturing method o a flexible AMOLED substrate, which improves flexing resistance of a bending section of a flexible AMOLED substrate so as to increase production yield.

Objectives of the present invention are also to provide a flexible AMOLED substrate having a bending section exhibiting improved flexing resistance and allowing for increased production yield.

To achieve the above objectives, the present invention provides a method for manufacturing a flexible AMOLED substrate, which comprises: forming a flexible backing, wherein the flexible backing comprises a display section and a bending section disposed on an outer circumference of the display section; and forming a buffer layer on the flexible backing such that a portion of the buffer layer that is disposed on the bending section is removed, while a portion of the buffer layer that is disposed on the display section is preserved.

The method for manufacturing a flexible AMOLED substrate specifically comprises the following steps:

Step S1: providing a rigid carrier board and forming the flexible backing on the rigid carrier board, wherein the flexible backing comprises the display section and the bending section disposed on the outer circumference of the display section; and forming the buffer layer on the flexible backing and forming a poly-silicon layer on the buffer layer; and Step S2: applying one half-mask based manufacturing process to simultaneously subject the poly-silicon layer and the buffer layer to patterning treatment so as to form an active layer and remove the portion of the buffer layer that is disposed on the bending section with the portion of the buffer layer that is disposed on the display section preserved.

Step S2 comprises:

Step S21: forming a photoresist layer on the poly-silicon layer; and providing a half-tone mask, wherein the half-tone mask comprises a first area, a second area, and a third area that is an area other than the first area and the second area; and the first area is set to correspond to a location where the active layer is to be formed and the second area is set to correspond to the bending section of the flexible backing:

Step S22: subjecting the photoresist layer to exposure and development with the half-tone mask so that a portion of the photoresist layer that corresponds to the second area of the half-tone mask is completely removed and a portion of the photoresist layer that corresponds to the third area of the half-tone mask 30 is reduced in thickness;

Step S23: subjecting the poly-silicon layer and the buffer layer to etching with the photoresist layer serving as an etch stop layer to so as to remove portions of the poly-silicon layer and the buffer layer that correspond to the bending section of the flexible backing;

Step S24: subjecting the photoresist layer to ashing treatment, so as to have the portion of the photoresist layer that corresponds to the third area of the half-tone mask completely removed and the portion of the photoresist layer that corresponds to the first area of the half-tone mask reduced in thickness;

Step S25: subjecting the poly-silicon layer to etching with the photoresist layer serving as an etch stop layer so as to form the active layer; and Step S26: peeling a remaining portion of the photoresist layer from the active layer.

In Step S21, the photoresist layer could be formed of a material that is a positive photoresist material and the second area has a light transmission rate that is greater than a light transmission rate of the third area and the light transmission rate of the third area is greater than a light transmission rate of the first area.

In Step S21, the photoresist layer could be formed of a material that is a negative photoresist material and the first area has a light transmission rate that is greater than a light transmission rate of the third area and the light transmission rate of the third area is greater than a light transmission rate of the second area.

The method for manufacturing a flexible AMOLED substrate further comprises: Step S3: forming a gate insulation layer on the active layer, the buffer layer, and the flexible backing, and forming a gate electrode on the gate insulation layer; and implanting doping ions in two end portions of the active layer through self-aligning with the gate electrode serving as a mask plate to so as to form a source contact zone and a drain contact zone and a channel zone that is disposed between the source contact zone and the drain contact zone and is located under and corresponding to the gate electrode;

Step S4: depositing an interlayer dielectric layer on the gate electrode and the gate insulation layer, subjecting the interlayer dielectric layer and the gate insulation layer to patterning treatment to form, in the interlayer dielectric layer and the gate insulation layer, a source contact hole and a drain contact hole that respectively correspond to the source contact zone and the drain contact zone of the active layer; and forming a source electrode and a drain electrode on the interlayer dielectric layer, such that the source electrode and the drain electrode are respectively set in contact with the source contact zone and the drain contact zone of the active layer through the source contact hole and the drain contact hole;

Step S5: forming a planarization layer on the source electrode, the drain electrode, and the interlayer dielectric layer and subjecting the planarization layer to patterning treatment so as to form, in the planarization layer, a first via that is located above and corresponds to the drain electrode; and forming an anode on the planarization layer, such that the anode is set in contact with the drain electrode through the first via;

Step S6: forming a pixel definition layer on the anode and the planarization layer, subjecting the pixel definition layer to patterning treatment to form, in the pixel definition layer, a second via that is located above and corresponds to the anode, and forming an OLED emissive layer in the second via to be disposed on the anode; and Step S7: separating the flexible backing and the rigid carrier board from each other so as to form a flexible AMOLED substrate.

The buffer layer has a thickness of 0.3-0.5 μm; the gate insulation layer has a thickness of 0.05-0.15 μm; the interlayer dielectric layer has a thickness of 0.15-0.25 μm.

The present invention also provides a flexible AMOLED substrate, which comprises a flexible backing, wherein the flexible backing comprises a display section and a bending section disposed on an outer circumference of the display section, and the display section of the flexible backing is provided thereon with a buffer layer arranged thereon, while the bending section of the flexible backing is not provided with a buffer layer thereon.

The display section of the flexible backing is also provided thereon with an active layer that is disposed on the buffer layer, a gate insulation layer that is disposed on the active layer and the buffer layer, a gate electrode that is disposed on the gate insulation layer, an interlayer dielectric layer that is disposed on the gate electrode and the gate insulation layer, a source electrode and a drain electrode that are disposed on the interlayer dielectric layer, a planarization layer that is disposed on the source electrode, the drain electrode, and the interlayer dielectric layer, an anode that is disposed on the planarization layer, a pixel definition layer that is disposed on the planarization layer and the anode, and an OLED emissive layer that is disposed on the anode;

the bending section of the flexible backing is provided with a gate insulation layer, an interlayer dielectric layer that is disposed on the gate insulation layer, a planarization layer that is disposed on the interlayer dielectric layer, and a pixel definition layer that is disposed on the planarization layer;

the active layer comprises a source contact zone and a drain contact zone and a channel zone that is disposed between the source contact zone and the drain contact zone and is located under and corresponding to the gate electrode; the source contact zone and the drain contact zone each contain doping ions therein;

the interlayer dielectric layer and the gate insulation layer are formed therein with a source contact hole and a drain contact hole that respectively correspond to the source contact zone and the drain contact zone of the active layer; the source electrode and the drain electrode are respectively set in contact with the source contact zone and the drain contact zone of the active layer through the source contact hole and the drain contact hole;

the planarization layer is formed with a first via that is located on and corresponds to the drain electrode and the anode is set in contact with the drain electrode through the first via; and the pixel definition layer is formed with a second via that is located on and corresponds to the anode and the OLED emissive layer is disposed in the second via.

The buffer layer has a thickness of 0.3-0.5 μm; the gate insulation layer has a thickness of 0.05-0.15 μm; the interlayer dielectric layer has a thickness of 0.15-0.25 μm.

The present invention further provides a method for manufacturing a flexible AMOLED substrate, which comprises: forming a flexible backing, wherein the flexible backing comprises a display section and a bending section disposed on an outer circumference of the display section; and forming a buffer layer on the flexible backing such that a portion of the buffer layer that is disposed on the bending section is removed, while a portion of the buffer layer that is disposed on the display section is preserved:

wherein the method comprises the following steps:

Step S1: providing a rigid carrier board and forming the flexible backing on the rigid carrier board, wherein the flexible backing comprises the display section and the bending section disposed on the outer circumference of the display section; and forming the buffer layer on the flexible backing and forming a poly-silicon layer on the buffer layer:

Step S2: applying one half-mask based manufacturing process to simultaneously subject the poly-silicon layer and the buffer layer to patterning treatment so as to form an active layer and remove the portion of the buffer layer that is disposed on the bending section with the portion of the buffer layer that is disposed on the display section preserved:

Step S3: forming a gate insulation layer on the active layer, the buffer layer, and the flexible backing, and forming a gate electrode on the gate insulation layer; and implanting doping ions in two end portions of the active layer through self-aligning with the gate electrode serving as a mask plate to so as to form a source contact zone and a drain contact zone and a channel zone that is disposed between the source contact zone and the drain contact zone and is located under and corresponding to the gate electrode;

Step S4: depositing an interlayer dielectric layer on the gate electrode and the gate insulation layer, subjecting the interlayer dielectric layer and the gate insulation layer to patterning treatment to form, in the interlayer dielectric layer and the gate insulation layer, a source contact hole and a drain contact hole that respectively correspond to the source contact zone and the drain contact zone of the active layer; and forming a source electrode and a drain electrode on the interlayer dielectric layer, such that the source electrode and the drain electrode are respectively set in contact with the source contact zone and the drain contact zone of the active layer through the source contact hole and the drain contact hole:

Step S5: forming a planarization layer on the source electrode, the drain electrode, and the interlayer dielectric layer and subjecting the planarization layer to patterning treatment so as to form, in the planarization layer, a first via that is located above and corresponds to the drain electrode; and forming an anode on the planarization layer, such that the anode is set in contact with the drain electrode through the first via;

Step S6: forming a pixel definition layer on the anode and the planarization layer, subjecting the pixel definition layer to patterning treatment to form, in the pixel definition layer, a second via that is located above and corresponds to the anode, and forming an OLED emissive layer in the second via to be disposed on the anode; and Step S7: separating the flexible backing and the rigid carrier board from each other so as to form a flexible AMOLED substrate;

wherein Step S2 comprises:

Step S21: forming a photoresist layer on the poly-silicon layer; and providing a half-tone mask, wherein the half-tone mask comprises a first area, a second area, and a third area that is an area other than the first area and the second area; and the first area is set to correspond to a location where the active layer is to be formed and the second area is set to correspond to the bending section of the flexible backing;

Step S22: subjecting the photoresist layer to exposure and development with the half-tone mask so that a portion of the photoresist layer that corresponds to the second area of the half-tone mask is completely removed and a portion of the photoresist layer that corresponds to the third area of the half-tone mask 30 is reduced in thickness;

Step S23: subjecting the poly-silicon layer and the buffer layer to etching with the photoresist layer serving as an etch stop layer to so as to remove portions of the poly-silicon layer and the buffer layer that correspond to the bending section of the flexible backing:

Step S24: subjecting the photoresist layer to ashing treatment, so as to have the portion of the photoresist layer that corresponds to the third area of the half-tone mask completely removed and the portion of the photoresist layer that corresponds to the first area of the half-tone mask reduced in thickness;

Step S25: subjecting the poly-silicon layer to etching with the photoresist layer serving as an etch stop layer so as to form the active layer; and Step S26: peeling a remaining portion of the photoresist layer from the active layer;

wherein the buffer layer has a thickness of 0.3-0.5 µm; the gate insulation layer has a thickness of 0.05-0.15 µm; the interlayer dielectric layer has a thickness of 0.15-0.25 µm.

The efficacy of the present invention is as follows. The manufacturing method of the flexible AMOLED substrate according to the present invention comprises: forming a flexible backing, wherein the flexible backing comprises a display section and a bending section disposed on an outer circumference of the display section; forming a buffer layer on the flexible backing, removing a portion of the buffer layer that is disposed on the bending section and preserving a portion of the buffer layer that is disposed on the display section so that an inorganic insulation layer on the bending section of the flexible AMOLED substrate could be of a reduced thickness to improve bending resistance of the bending section of the flexible AMOLED substrate and thus improving production yield. The flexible AMOLED substrate according to the present invention is manufactured with the above method, wherein an inorganic insulation layer included in a bending section of a flexible AMOLED substrate is of a reduced thickness so that the bending section of the flexible AMOLED substrate shows better resistance against bending and provides high production yield.

For better understanding of the features and technical contents of the present invention, reference will be made to the following detailed description of the present invention and the attached drawings. However, the drawings are provided only for reference and illustration and are not intended to limit the present invention.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

The present invention provides a method for manufacturing a flexible active matrix organic light emitting display (AMOLED) substrate, which comprises: forming a flexible backing 11, wherein the flexible backing 11 comprises a display section and a bending section disposed on an outer circumference of the display section; forming a buffer layer 12 on the flexible backing 11 and removing a portion of the buffer layer 12 that is located on the bending section and preserving a portion of the buffer layer 12 that is located on the display section. The method helps make the bending section that is included in a flexible AMOLED substrate that is subsequently formed more resistant to bending and improves production yield.

Figure 1:
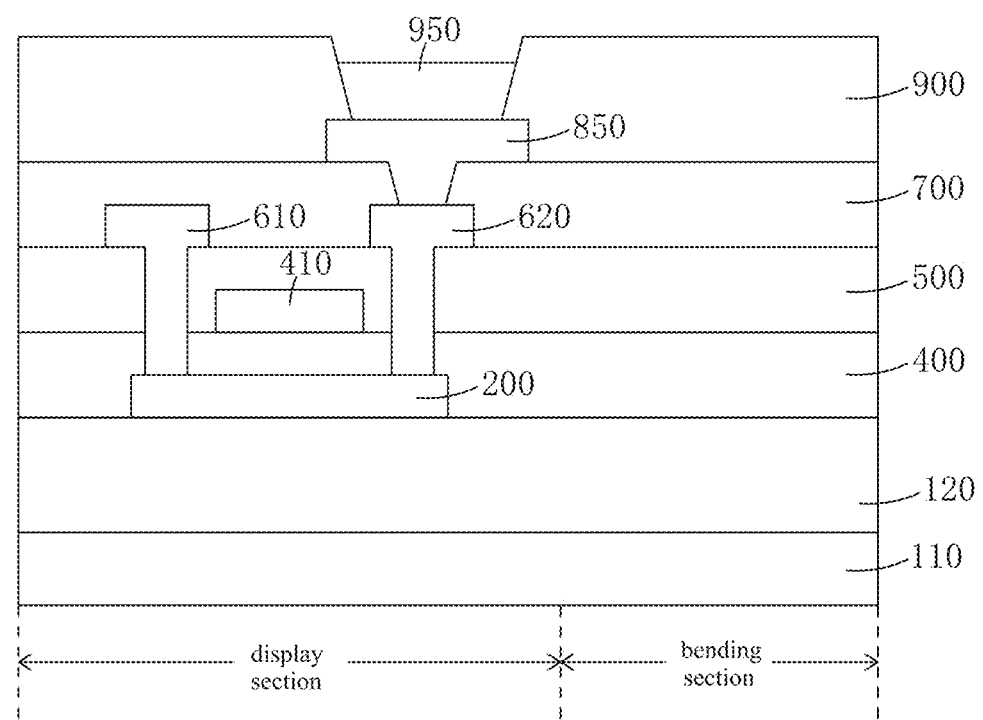
FIG. 1 is a schematic view showing a known flexible active matrix organic light emitting display (AMOLED) substrate.
Figure 2:
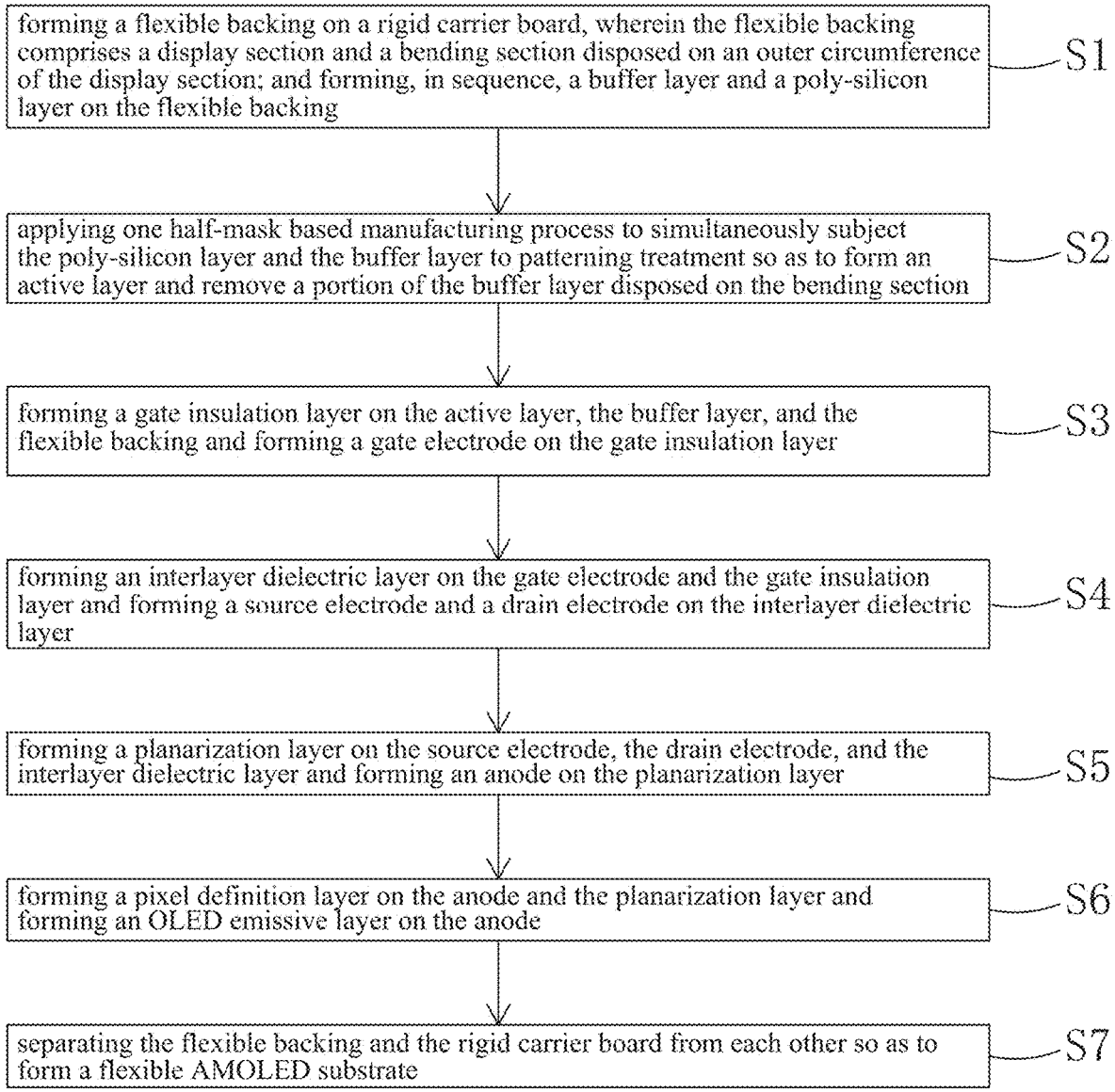
FIG. 2 is a flow chart illustrating a manufacturing method of a flexible AMOLED substrate according to the present invention.
Figure 3:
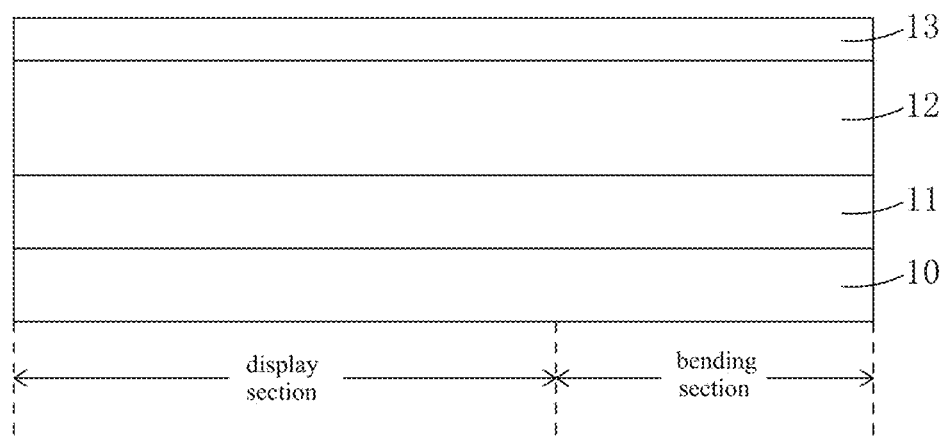
FIG. 3 is a schematic view illustrating Step S of the manufacturing method of a flexible AMOLED substrate according to the present invention.

Specifically, referring to FIG. 2, the method for manufacturing a flexible AMOLED substrate specifically comprises the following steps:

Step S1: as shown in FIG. 3, providing a rigid carrier board 10 and forming a flexible backing 11 on the rigid carrier board 10, wherein the flexible backing 11 comprises a display section and a bending section disposed on an outer circumference of the display section; forming a buffer layer 12 on the flexible backing 11 and forming a poly-silicon layer 13 on the buffer layer 12.

Specifically, in Step S1, the rigid carrier board 10 comprises a glass plate and the flexible backing 11 comprises a polyimide (PI) film. The PI film is formed with coating and curing processes.

Specifically, the buffer layer 12 is formed with chemical vapor deposition (CVD).

Specifically, a process of forming the poly-silicon layer 13 on the buffer layer 12 comprises: applying chemical vapor deposition to form an amorphous silicon layer on the buffer layer 12, subjecting the amorphous silicon layer to dehydrogenation treatment, and then applying excimer laser anneal (ELA) to crystallize and convert the amorphous silicon layer into a poly-silicon layer 13.

Specifically, the buffer layer 12 comprises a silicon nitride (SiNx) layer disposed on the flexible backing 11 and a silicon oxide (SiOx) layer disposed on the silicon nitride (SiNx) layer.

Specifically, the buffer layer 12 has a thickness of 0.3-0.5 μm, preferably 0.351 μm.

Specifically, a portion of the buffer layer 12 that is disposed on the display section provide an excellent effect of temperature keeping when the amorphous silicon is crystallized into and forms poly-silicon and prevents impurity ions from affecting a channel zone 23 of an active layer 20 that is formed subsequently.

Specifically, a portion of the buffer layer 12 that is disposed on the bending section increases the thickness of an inorganic insulation layer in the bending section so that the bending section of a flexible AMOLED substrate that is formed subsequently would exhibit poor resistance against bending or even breaking, severely affecting production yield of the flexible AMOLED substrate.

Step S2: as shown in FIGS. 4-10, applying one half-mask based manufacturing process to simultaneously subject the poly-silicon layer 13 and the buffer layer 12 to patterning treatment so as to form an active layer 20 and remove the portion of the buffer layer 12 that is disposed on the bending section with the portion of the buffer layer 12 that is disposed on the display section preserved.

Figure 4:
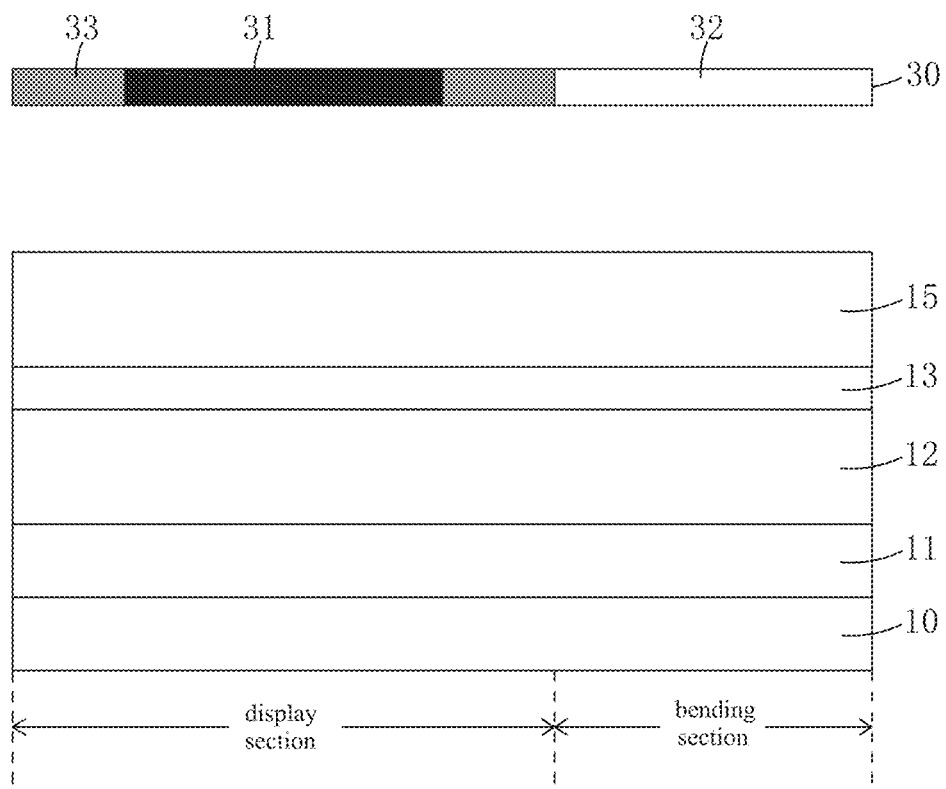
FIG. 4 is a schematic view illustrating Step S21 of a first example of the manufacturing method of a flexible AMOLED substrate according to the present invention.
Figure 5:
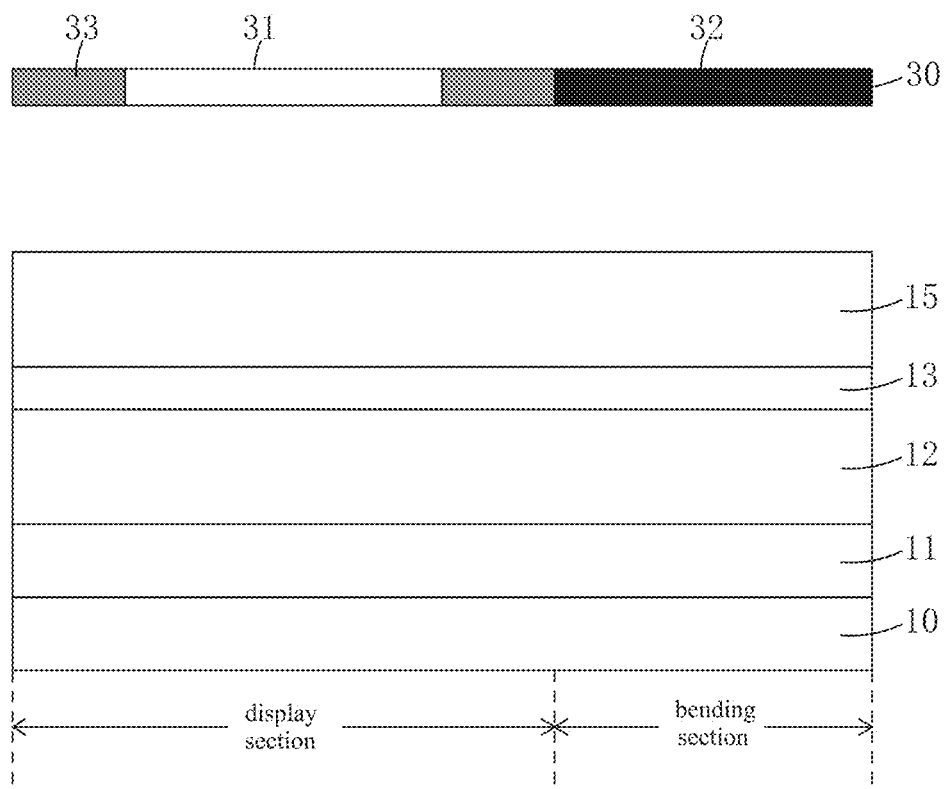
FIG. 5 is a schematic view illustrating Step S21 of a second example of the manufacturing method of a flexible AMOLED substrate according to the present invention.

Specifically, Step S2 comprises:

Step S21: as shown in FIG. 4 or 5, forming a photoresist layer 15 on the poly-silicon layer 13; and providing a half-tone mask 30, wherein the half-tone mask 30 comprises a first area 31, a second area 32, and a third area 33 that is an area other than the first area 31 and the second area 32; and the first area 31 is set to correspond to a location where the active layer is to be formed and the second area 32 is set to correspond to the bending section of the flexible backing 11.

Specifically, as shown in FIG. 4, in Step S21, the photoresist layer 15 could be formed of a material that is a positive photoresist material. Under such a condition, the second area 32 has a light transmission rate that is greater than a light transmission rate of the third area 33 and the light transmission rate of the third area 33 is greater than a light transmission rate of the first area 31; preferably, the light transmission rate of the second area 32 is 100%, the light transmission rate of the third area 33 is 50%, and the light transmission rate of the first area 31 is 0.

Specifically, as shown in FIG. 5, in Step S21, the photoresist layer 15 could be formed of a material that is a negative photoresist material. Under such a condition, the light transmission rate of the first area 31 is greater than the light transmission rate of the third area 33 and the light transmission rate of the third area 33 is greater than the light transmission rate of the second area 32. Preferably, the light transmission rate of the first area 31 is 100%, the light transmission rate of the third area 33 is 50%, and the light transmission rate of the second area 32 is 0.

Figure 6:
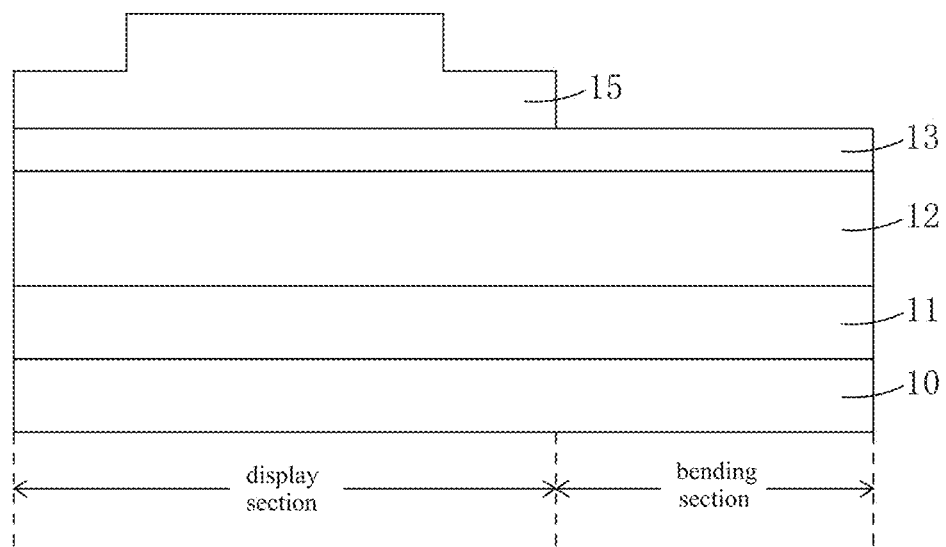
FIG. 6 is a schematic view illustrating Step S22 of the manufacturing method of a flexible AMOLED substrate according to the present invention.

Step S22: as shown in FIG. 6, subjecting the photoresist layer 15 to exposure and development with the half-tone mask 30 so that a portion of the photoresist layer 15 that corresponds to the second area 32 of the half-tone mask 30 is completely removed and a portion of the photoresist layer 15 that corresponds to the third area 33 of the half-tone mask 30 is reduced in thickness.

Figure 7:
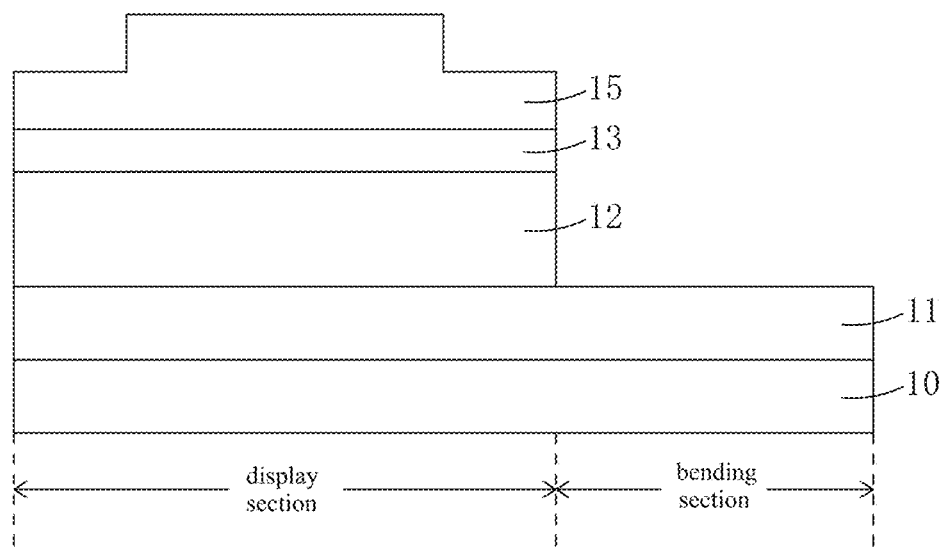
FIG. 7 is a schematic view illustrating Step S23 of the manufacturing method of a flexible AMOLED substrate according to the present invention.

Step S23: as shown in FIG. 7, subjecting the poly-silicon layer 13 and the buffer layer 12 to etching with the photoresist layer 15 serving as an etch stop layer to so as to remove portions of the poly-silicon layer 13 and the buffer layer 12 that correspond to the bending section of the flexible backing 11.

Figure 8:
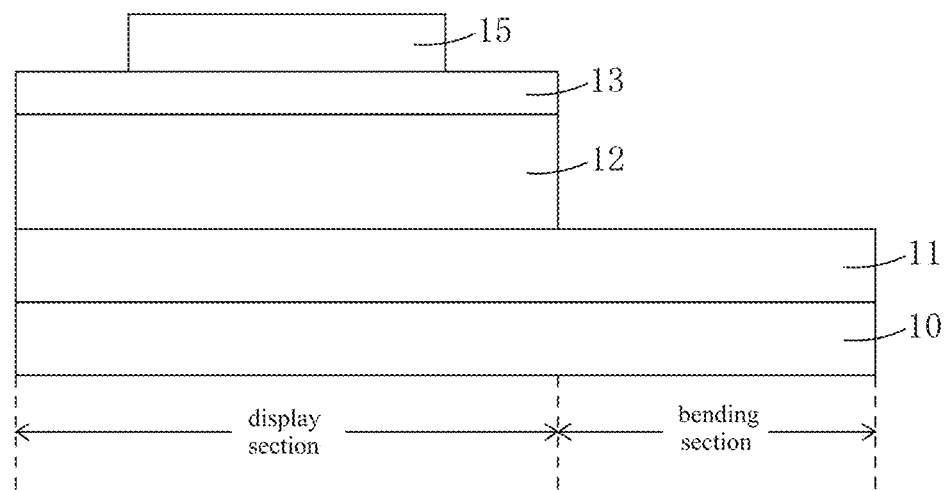
FIG. 8 is a schematic view illustrating Step S24 of the manufacturing method of a flexible AMOLED substrate according to the present invention.

Step S24: as shown in FIG. 8, subjecting the photoresist layer 15 to ashing treatment, so as to have the portion of the photoresist layer 15 that corresponds to the third area 33 of the half-tone mask 30 completely removed and the portion of the photoresist layer 15 that corresponds to the first area 31 of the half-tone mask 30 reduced in thickness.

Figure 9:
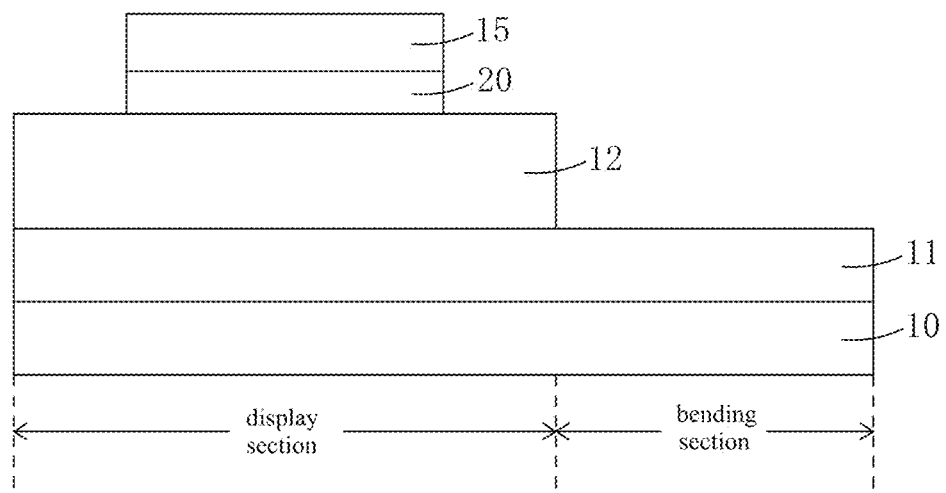
FIG. 9 is a schematic view illustrating Step S25 of the manufacturing method of a flexible AMOLED substrate according to the present invention.

Step S25: as shown in FIG. 9, subjecting the poly-silicon layer 13 to etching with the photoresist layer 15 serving as an etch stop layer so as to form an active layer 20.

Figure 10:
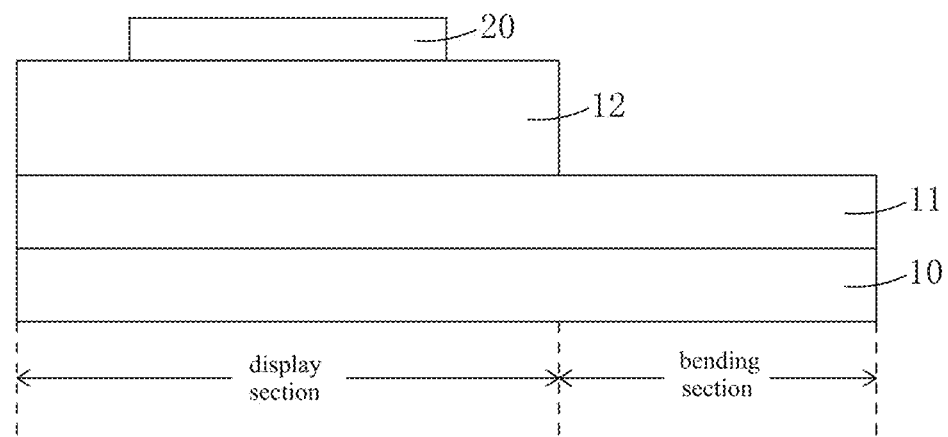
FIG. 10 is a schematic view illustrating Step S26 of the manufacturing method of a flexible AMOLED substrate according to the present invention.

Step S26: as shown in FIG. 10, peeling a remaining portion of the photoresist layer 15 from the active layer 20.

Step S2 uses one half-mask based manufacturing process to subject the poly-silicon layer 13 and the buffer layer 12 to patterning treatment simultaneously, so as to form the active layer 20 and also to remove the portion of the buffer layer 12 that is disposed on the bending section, whereby the bending section of the subsequently formed flexible AMOLED substrate would have an inorganic insulation layer of a reduced thickness, helping improve the resistance of the bending section of the flexible AMOLED substrate against bending and thus enhancing production yield. Further, with the patterning treatment of the poly-silicon layer 13 and the buffer layer 12 being involved in just one half-mask based manufacturing process, the cost of mask could be saved and the fabrication time could be reduced so as to lower down fabrication cost and simplify operation process.

Figure 11:
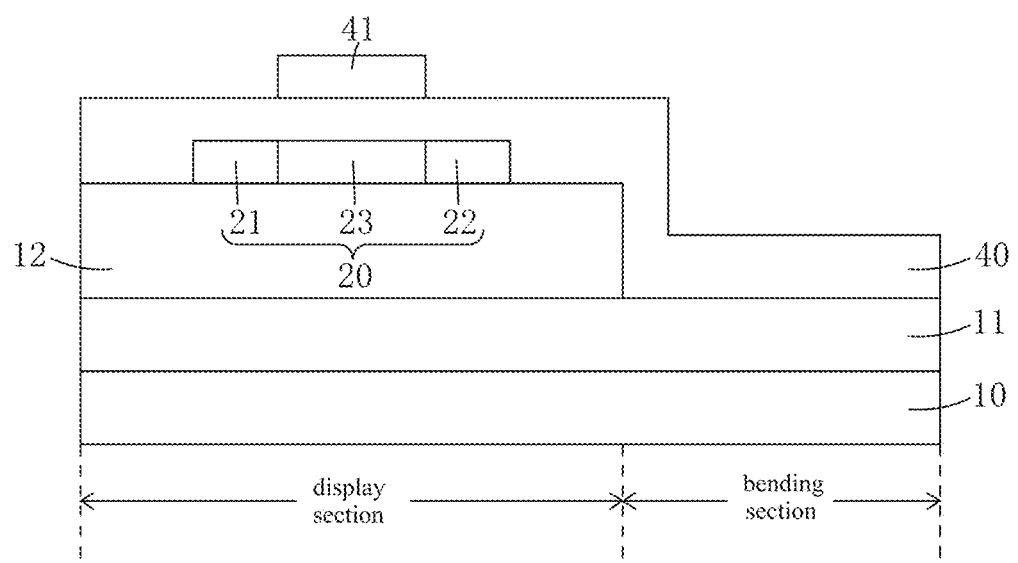
FIG. 11 is a schematic view illustrating Step S3 of the manufacturing method of a flexible AMOLED substrate according to the present invention.

Step S3: as shown in FIG. 11, forming a gate insulation layer 40 on the active layer 20, the buffer layer 12, and the flexible backing 11, and forming a gate electrode 41 on the gate insulation layer 40; and implanting doping ions in two end portions of the active layer 20 through self-aligning with the gate electrode 41 serving as a mask plate to so as to form a source contact zone 21 and a drain contact zone 22 and a channel zone 23 that is disposed between the source contact zone 21 and the drain contact zone 22 and is located under and corresponding to the gate electrode 41.

Specifically, the gate insulation layer 40 is formed with chemical vapor deposition (CVD).

Specifically, the gate insulation layer 40 comprises a silicon oxide (SiOx) layer disposed on the active layer 20, the buffer layer 12, and the flexible backing 11.

Specifically, the gate insulation layer 40 has a thickness of 0.05-0.15 μm, preferably 0.1 μm.

Specifically, the gate electrode 41 comprises a gate metal layer, and the gate metal layer comprises a molybdenum (Mo) film.

Specifically, a process for forming a gate electrode 41 on the gate insulation layer 40 comprises: applying physical vapor deposition (PVD) to deposit a gate metal layer on the gate insulation layer 40 and subjecting the gate metal layer to patterning treatment to form a gate electrode 41.

Specifically, the gate electrode 41 is arranged at a location above and corresponding to the active layer 20.

Specifically, the doping ions are P type ions and the P type ions are preferably boron ions.

Figure 12:
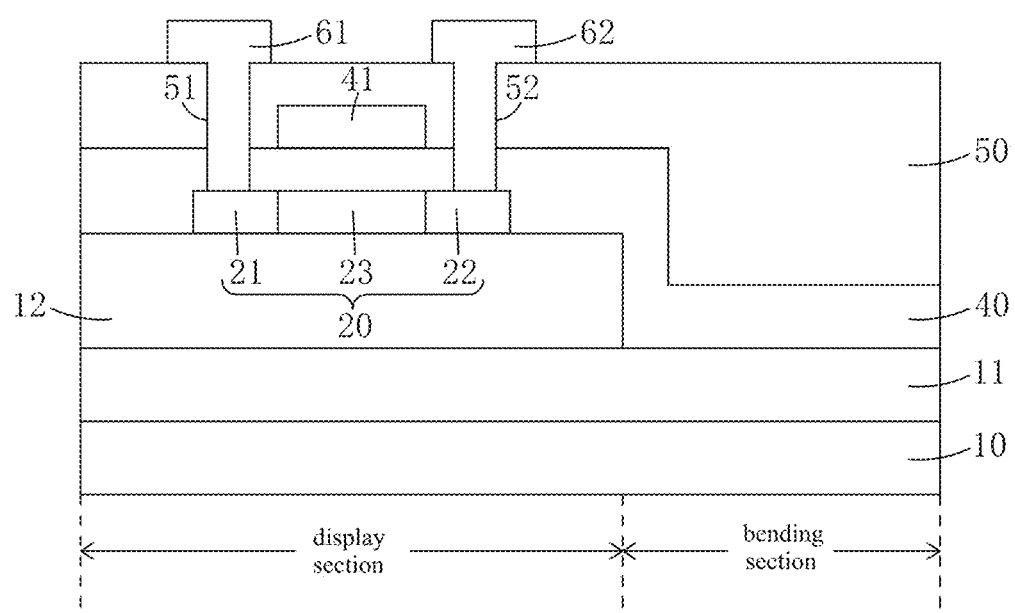
FIG. 12 is a schematic view illustrating Step S4 of the manufacturing method of a flexible AMOLED substrate according to the present invention.

Step S4: as shown in FIG. 12, depositing an interlayer dielectric layer 50 on the gate electrode 41 and the gate insulation layer 40, subjecting the interlayer dielectric layer 50 and the gate insulation layer 40 to patterning treatment to form, in the interlayer dielectric layer 50 and the gate insulation layer 40, a source contact hole 51 and a drain contact hole 52 that respectively correspond to the source contact zone 21 and the drain contact zone 22 of the active layer 20; and forming a source electrode 61 and a drain electrode 62 on the interlayer dielectric layer 50, such that the source electrode 61 and the drain electrode 62 are respectively set in contact with the source contact zone 21 and the drain contact zone 22 of the active layer 20 through the source contact hole 51 and the drain contact hole 52.

Specifically, the source electrode 61 and the drain electrode 62 each comprise a source/drain metal layer, and the source/drain metal layer comprises an aluminum (Al) film and molybdenum (Mo) films respectively disposed on two sides of the aluminum film.

Specifically, a process for forming a source electrode 61 and a drain electrode 62 on the interlayer dielectric layer 50 comprises: applying physical vapor deposition (PVD) to deposit a source/drain metal layer on the interlayer dielectric layer 50 and subjecting the source/drain metal layer to patterning treatment to form a source electrode 61 and a drain electrode 62.

Specifically, the interlayer dielectric layer 50 is formed with chemical vapor deposition (CVD).

Specifically, the interlayer dielectric layer 50 comprises a silicon oxide (SiOx) layer disposed on the gate electrode 41 and the gate insulation layer 40 and a silicon nitride (SiNx) layer disposed on the silicon oxide (SiOx) layer.

Specifically, the interlayer dielectric layer 50 has a thickness of 0.15-0.25 μm, preferably 0.2 μm.

Figure 13:
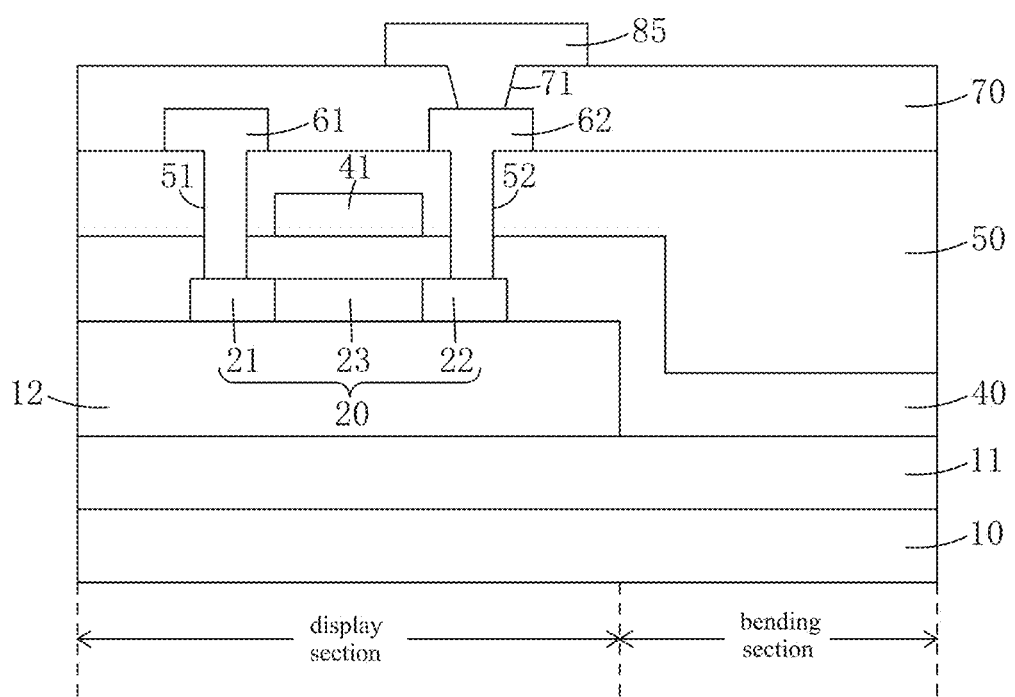
FIG. 13 is a schematic view illustrating Step S5 of the manufacturing method of a flexible AMOLED substrate according to the present invention.

Step S5: as shown in FIG. 13, forming a planarization layer 70 on the source electrode 61, the drain electrode 62, and the interlayer dielectric layer 50 and subjecting the planarization layer 70 to patterning treatment so as to form, in the planarization layer 70, a first via 71 that is located above and corresponds to the drain electrode 62; and forming an anode 85 on the planarization layer 70, such that the anode 85 is set in contact with the drain electrode 62 through the first via 71.

Specifically, the anode 85 comprises a silver (Ag) film and indium tin oxide (ITO) films respectively disposed on two sides of the silver film.

Figure 14:
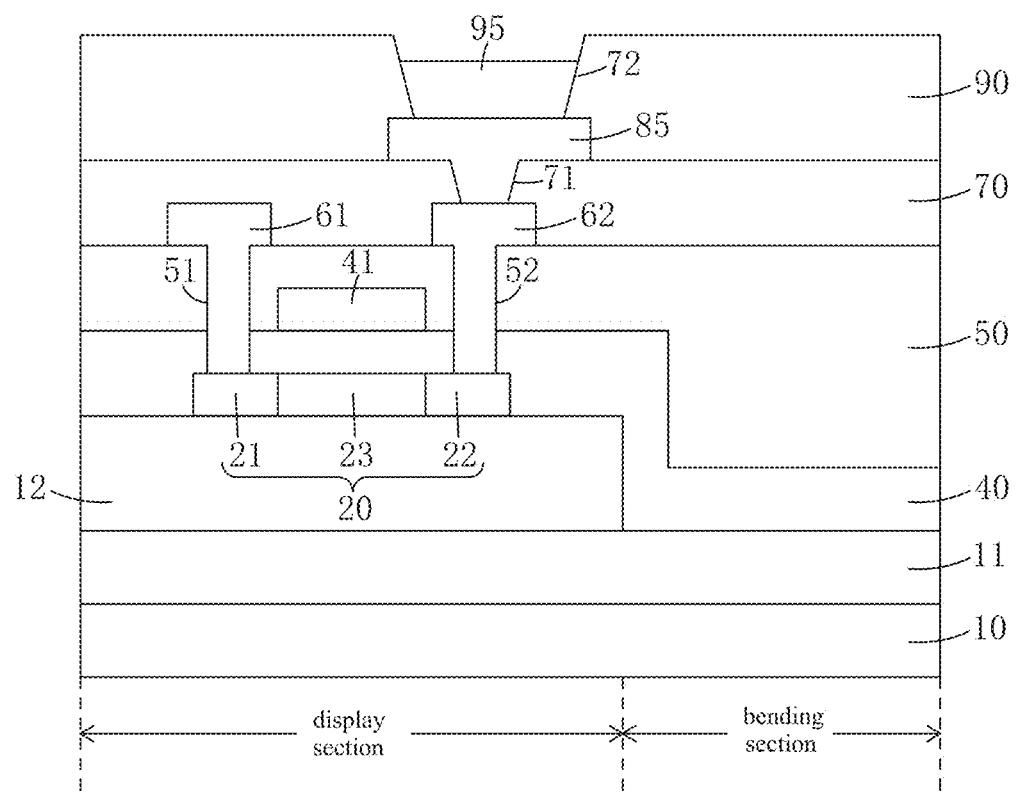
FIG. 14 is a schematic view illustrating Step S6 of the manufacturing method of a flexible AMOLED substrate according to the present invention.

Step S6: as shown in FIG. 14, forming a pixel definition layer 90 on the anode 85 and the planarization layer 70, subjecting the pixel definition layer 90 to patterning treatment to form, in the pixel definition layer 90, a second via 72 that is located above and corresponds to the anode 85, and forming an OLED emissive layer 95 in the second via 72 to be disposed on the anode 85.

Specifically, the pixel definition layer 90 and the planarization layer 70 are formed of materials that are similarly an organic photoresist material, and the organic photoresist material comprises polyimide.

Specifically, the OLED emissive layer 95 is formed with vapor deposition.

Figure 15:
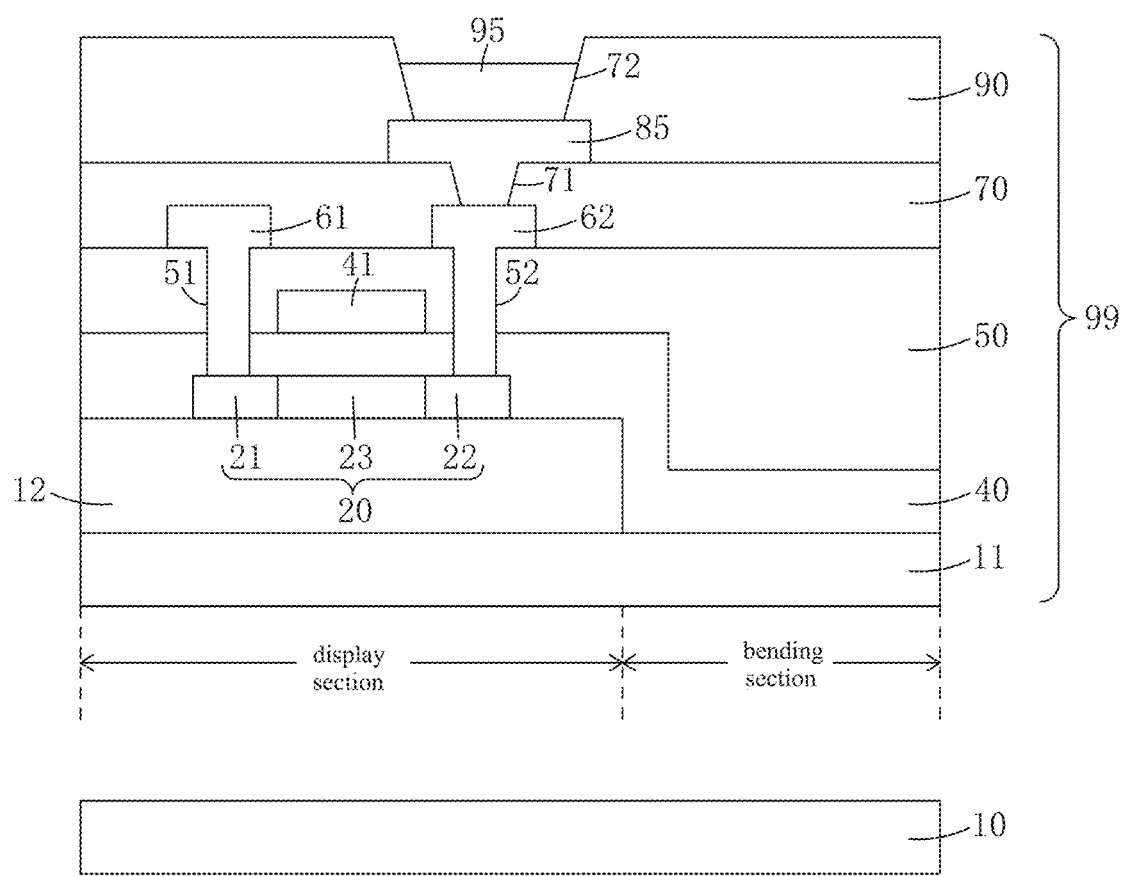
FIG. 15 is a schematic view illustrating Step S7 of the manufacturing method of a flexible AMOLED substrate according to the present invention.

Step S7: as shown in FIG. 15, separating the flexible backing 11 and the rigid carrier board 10 from each other so as to form a flexible AMOLED substrate 99.

Specifically, a laser lift-off (LLO) operation is applied to separate the flexible backing 11 and the rigid carrier board 10 from each other.

The present invention provides a method for manufacturing a flexible AMOLED substrate, which comprises: forming a flexible backing 11, wherein the flexible backing 11 comprises a display section and a bending section disposed on an outer circumference of the display section; forming a buffer layer 12 on the flexible backing 11, removing a portion of the buffer layer 12 that is disposed on the bending section, and preserving a portion of the buffer layer 12 that is disposed on the display section so that an inorganic insulation layer arranged on the bending section of the flexible AMOLED substrate could be reduced in thickness thereof thereby improving bending resistance of the bending section of the flexible AMOLED substrate against and thus improving production yield.

Figure 16:
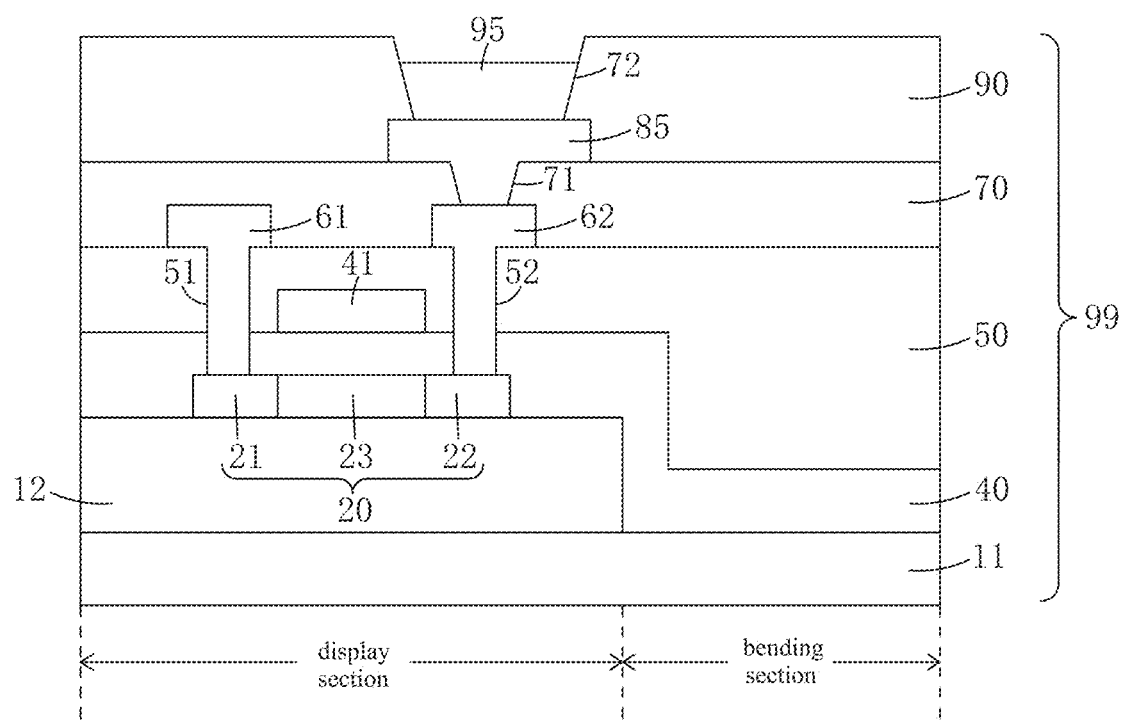
FIG. 16 is a schematic view illustrating a structure of a flexible AMOLED substrate according to the present invention.

Referring to FIG. 16, based on the method for manufacturing a flexible AMOLED substrate, the present invention also provides a flexible AMOLED substrate 99, which comprises a flexible backing 11. The flexible backing 11 comprises a display section and a bending section disposed on an outer circumference of the display section. The display section of the flexible backing 11 is provided with a buffer layer 12 thereon, while the bending section of the flexible backing 11 is not provided with the buffer layer 12.

Specifically, the display section of the flexible backing 11 is also provided thereon with an active layer 20 that is disposed on the buffer layer 12, a gate insulation layer 40 that is disposed on the active layer 20 and the buffer layer 12, a gate electrode 41 that is disposed on the gate insulation layer 40, an interlayer dielectric layer 50 that is disposed on the gate electrode 41 and the gate insulation layer 40, a source electrode 61 and a drain electrode 62 that are disposed on the interlayer dielectric layer 50, a planarization layer 70 that is disposed on the source electrode 61, the drain electrode 62, and the interlayer dielectric layer 50, an anode 85 that is disposed on the planarization layer 70, a pixel definition layer 90 that is disposed on the planarization layer 70 and the anode 85, and an OLED emissive layer 95 that is disposed on the anode 85; and the bending section of the flexible backing 11 is provided with a gate insulation layer 40, an interlayer dielectric layer 50 that is disposed on the gate insulation layer 40, a planarization layer 70 that is disposed on the interlayer dielectric layer 50, and a pixel definition layer 90 that is disposed on the planarization layer 70.

The active layer 20 comprises a source contact zone 21 and a drain contact zone 22 and a channel zone 23 that is disposed between the source contact zone 21 and the drain contact zone 22 and is located under and corresponding to the gate electrode 41. The source contact zone 21 and the drain contact zone 22 each contain doping ions therein.

The interlayer dielectric layer 50 and the gate insulation layer 40 are formed therein with a source contact hole 51 and a drain contact hole 52 that respectively correspond to the source contact zone 21 and the drain contact zone 22 of the active layer 20. The source electrode 61 and the drain electrode 62 are respectively set in contact with the source contact zone 21 and the drain contact zone 22 of the active layer 20 through the source contact hole 51 and the drain contact hole 52.

The planarization layer 70 is formed with a first via 71 that is located on and corresponds to the drain electrode 62. The anode 85 is set in contact with the drain electrode 62 through the first via 71.

The pixel definition layer 90 is formed with a second via 71 that is located on and corresponds to the anode 85. The OLED emissive layer 95 is disposed in the second via 72.

Specifically, the flexible backing 11 comprises a polyimide (PI) film.

Specifically, the buffer layer 12 comprises a silicon nitride (SiNx) layer disposed on the flexible backing 11 and a silicon oxide (SiOx) layer disposed on the silicon nitride (SiNx) layer.

Specifically, the gate insulation layer 40 comprises a silicon oxide (SiOx) layer disposed on the active layer 20, the buffer layer 12, and the flexible backing 11.

Specifically, the gate electrode 41 comprises a gate metal layer, and the gate metal layer comprises a molybdenum (Mo) film.

Specifically, the gate electrode 41 is arranged to be located above the active layer 20.

Specifically, the doping ions are P type ions. The P type ions are preferably boron ions.

Specifically, the source electrode 61 and the drain electrode 62 each comprise a source/drain metal layer. The source/drain metal layer comprises an aluminum (Al) film and molybdenum (Mo) films respectively disposed on two sides of the aluminum film.

Specifically, the interlayer dielectric layer 50 comprises a silicon oxide (SiOx) layer disposed on the gate electrode 41 and the gate insulation layer 40 and a silicon nitride (SiNx) layer disposed on the silicon oxide (SiOx) layer.

Specifically, the anode 85 comprises a silver (Ag) film and indium tin oxide (ITO) films respectively disposed on two sides of the silver film.

Specifically, the pixel definition layer 90 and the planarization layer 70 are formed of materials that are similarly an organic photoresist material, and the organic photoresist material comprises polyimide.

Specifically, the buffer layer 12 has a thickness of 0.3-0.5 μm, preferably 0.35 μm.

Specifically, the gate insulation layer 40 has a thickness of 0.05-0.15 μm, preferably 0.1 μm.

Specifically, the interlayer dielectric layer 50 has a thickness of 0.15-0.25 μm, preferably 0.2 μm.

The present invention provides a bending section arranged on an outer circumference of a display section of a flexible AMOLED substrate, wherein the bending section of the flexible AMOLED substrate, after being attached with a driver integrated circuit (IC), is bent to a back side of the display section to reduce the ratio of a non-display section of a display screen and increase the ratio of the display section, shrinking an edge frame of the display device to thereby facilitate fabrication of a slim-frame display device.

The present invention provides a flexible AMOLED substrate that comprises a flexible backing 11. The flexible backing 11 comprises a display section and a bending section disposed on an outer circumference of the display section. The display section of the flexible backing 11 is provided thereon with a buffer layer 12, while the bending section of the flexible backing 11 is not provided thereon with a buffer layer 12, so that an inorganic insulation layer of the bending section of the flexible AMOLED substrate could be of a reduced thickness and thus, the bending section of the flexible AMOLED substrate may have improved bending resistance and a high production yield.

In summary, the present invention provides a flexible AMOLED substrate and a manufacturing method thereof. The manufacturing method of the flexible AMOLED substrate according to the present invention comprises: forming a flexible backing, wherein the flexible backing comprises a display section and a bending section disposed on an outer circumference of the display section; forming a buffer layer on the flexible backing, removing a portion of the buffer layer that is disposed on the bending section and preserving a portion of the buffer layer that is disposed on the display section so that an inorganic insulation layer on the bending section of the flexible AMOLED substrate could be of a reduced thickness to improve bending resistance of the bending section of the flexible AMOLED substrate and thus improving production yield. The flexible AMOLED substrate according to the present invention is manufactured with the above method, wherein an inorganic insulation layer included in a bending section of a flexible AMOLED substrate is of a reduced thickness so that the bending section of the flexible AMOLED substrate shows better resistance against bending and provides high production yield.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. A method for manufacturing a flexible active matrix organic light emitting display (AMOLED) substrate, comprising: forming a flexible backing, wherein the flexible backing comprises a display section and a bending section disposed on an outer circumference of the display section; and forming a buffer layer on the flexible backing such that a portion of the buffer layer that is disposed on the bending section is removed, while a portion of the buffer layer that is disposed on the display section is preserved; and comprising the following steps:

Step S1: providing a rigid carrier board and forming the flexible backing on the rigid carrier board, wherein the flexible backing comprises the display section and the bending section disposed on the outer circumference of the display section; and
   forming the buffer layer on the flexible backing and forming a poly-silicon layer on the buffer layer; and
   Step S2: applying one half-mask based manufacturing process to simultaneously subject the poly-silicon layer and the buffer layer to patterning treatment so as to form an active layer and remove the portion of the buffer layer that is disposed on the bending section with the portion of the buffer layer that is disposed on the display section preserved.

2. The method for manufacturing a flexible AMOLED substrate according to claim 1, wherein Step S2 comprises:
   Step S21: forming a photoresist layer on the poly-silicon layer; and
   providing a half-tone mask, wherein the half-tone mask comprises a first area, a second area, and a third area that is an area other than the first area and the second area; and the first area is set to correspond to a location where the active layer is to be formed and the second area is set to correspond to the bending section of the flexible backing;
   Step S22: subjecting the photoresist layer to exposure and development with the half-tone mask so that a portion of the photoresist layer that corresponds to the second area of the half-tone mask is completely removed and a portion of the photoresist layer that corresponds to the third area of the half-tone mask 30 is reduced in thickness;
   Step S23: subjecting the poly-silicon layer and the buffer layer to etching with the photoresist layer serving as an etch stop layer to so as to remove portions of the poly-silicon layer and the buffer layer that correspond to the bending section of the flexible backing;
   Step S24: subjecting the photoresist layer to ashing treatment, so as to have the portion of the photoresist layer that corresponds to the third area of the half-tone mask completely removed and the portion of the photoresist layer that corresponds to the first area of the half-tone mask reduced in thickness;
   Step S25: subjecting the poly-silicon layer to etching with the photoresist layer serving as an etch stop layer so as to form the active layer; and
   Step S26: peeling a remaining portion of the photoresist layer from the active layer.

3. The method for manufacturing a flexible AMOLED substrate according to claim 2, wherein in Step S21, the photoresist layer is formed of a material that is a positive photoresist material and the second area has a light transmission rate that is greater than a light transmission rate of the third area and the light transmission rate of the third area is greater than a light transmission rate of the first area.

4. The method for manufacturing a flexible AMOLED substrate according to claim 2, wherein in Step S21, the photoresist layer is formed of a material that is a negative photoresist material and the first area has a light transmission rate that is greater than a light transmission rate of the third area and the light transmission rate of the third area is greater than a light transmission rate of the second area.

5. The method for manufacturing a flexible AMOLED substrate according to claim 1, further comprising: Step S3: forming a gate insulation layer on the active layer, the buffer layer, and the flexible backing, and forming a gate electrode on the gate insulation layer; and
   implanting doping ions in two end portions of the active layer through self-aligning with the gate electrode serving as a mask plate to so as to form a source contact zone and a drain contact zone and a channel zone that is disposed between the source contact zone and the drain contact zone and is located under and corresponding to the gate electrode;
   Step S4: depositing an interlayer dielectric layer on the gate electrode and the gate insulation layer, subjecting the interlayer dielectric layer and the gate insulation layer to patterning treatment to form, in the interlayer dielectric layer and the gate insulation layer, a source contact hole and a drain contact hole that respectively correspond to the source contact zone and the drain contact zone of the active layer; and
   forming a source electrode and a drain electrode on the interlayer dielectric layer, such that the source electrode and the drain electrode are respectively set in contact with the source contact zone and the drain contact zone of the active layer through the source contact hole and the drain contact hole;
   Step S5: forming a planarization layer on the source electrode, the drain electrode, and the interlayer dielectric layer and subjecting the planarization layer to patterning treatment so as to form, in the planarization layer, a first via that is located above and corresponds to the drain electrode; and forming an anode on the planarization layer, such that the anode is set in contact with the drain electrode through the first via;

Step S6: forming a pixel definition layer on the anode and the planarization layer, subjecting the pixel definition layer to patterning treatment to form, in the pixel definition layer, a second via that is located above and corresponds to the anode, and forming an OLED emissive layer in the second via to be disposed on the anode; and Step S7: separating the flexible backing and the rigid carrier board from each other so as to form a flexible AMOLED substrate.

6. The method for manufacturing a flexible AMOLED substrate according to claim 5, wherein the buffer layer has a thickness of 0.3-0.5 µm; the gate insulation layer has a thickness of 0.05-0.15 µm; the interlayer dielectric layer has a thickness of 0.15-0.25 µm.

7. A flexible active matrix organic light emitting display (AMOLED) substrate, comprising a flexible backing, wherein the flexible backing comprises a display section and a bending section disposed on an outer circumference of the display section, and the display section of the flexible backing is provided thereon with a buffer layer arranged thereon, while the bending section of the flexible backing is not provided with a buffer layer thereon;

wherein the display section of the flexible backing is also provided thereon with an active layer that is disposed on the buffer layer, a gate insulation layer that is disposed on the active layer and the buffer layer, a gate electrode that is disposed on the gate insulation layer, an interlayer dielectric layer that is disposed on the gate electrode and the gate insulation layer, a source electrode and a drain electrode that are disposed on the interlayer dielectric layer, a planarization layer that is disposed on the source electrode, the drain electrode, and the interlayer dielectric layer, an anode that is disposed on the planarization layer, a pixel definition layer that is disposed on the planarization layer and the anode, and an OLED emissive layer that is disposed on the anode;

the bending section of the flexible backing is provided with a gate insulation layer, an interlayer dielectric layer that is disposed on the gate insulation layer, a planarization layer that is disposed on the interlayer dielectric layer, and a pixel definition layer that is disposed on the planarization layer;

the active layer comprises a source contact zone and a drain contact zone and a channel zone that is disposed between the source contact zone and the drain contact zone and is located under and corresponding to the gate electrode;

the source contact zone and the drain contact zone each contain doping ions therein;

the interlayer dielectric layer and the gate insulation layer are formed therein with a source contact hole and a drain contact hole that respectively correspond to the source contact zone and the drain contact zone of the active layer; the source electrode and the drain electrode are respectively set in contact with the source contact zone and the drain contact zone of the active layer through the source contact hole and the drain contact hole;

the planarization layer is formed with a first via that is located on and corresponds to the drain electrode and the anode is set in contact with the drain electrode through the first via; and the pixel definition layer is formed with a second via that is located on and corresponds to the anode and the OLED emissive layer is disposed in the second via;

wherein the buffer layer has a thickness of 0.3-0.5 µm; the gate insulation layer has a thickness of 0.05-0.15 µm; the interlayer dielectric layer has a thickness of 0.15-0.25 µm.

8. A method for manufacturing a flexible active matrix organic light emitting display (AMOLED) substrate, comprising: forming a flexible backing, wherein the flexible backing comprises a display section and a bending section disposed on an outer circumference of the display section; and forming a buffer layer on the flexible backing such that a portion of the buffer layer that is disposed on the bending section is removed, while a portion of the buffer layer that is disposed on the display section is preserved;

wherein the method comprises the following steps:

Step S1: providing a rigid carrier board and forming the flexible backing on the rigid carrier board, wherein the flexible backing comprises the display section and the bending section disposed on the outer circumference of the display section; and forming the buffer layer on the flexible backing and forming a poly-silicon layer on the buffer layer;

Step S2: applying one half-mask based manufacturing process to simultaneously subject the poly-silicon layer and the buffer layer to patterning treatment so as to form an active layer and remove the portion of the buffer layer that is disposed on the bending section with the portion of the buffer layer that is disposed on the display section preserved;

Step S3: forming a gate insulation layer on the active layer, the buffer layer, and the flexible backing, and forming a gate electrode on the gate insulation layer; and implanting doping ions in two end portions of the active layer through self-aligning with the gate electrode serving as a mask plate to so as to form a source contact zone and a drain contact zone and a channel zone that is disposed between the source contact zone and the drain contact zone and is located under and corresponding to the gate electrode;

Step S4: depositing an interlayer dielectric layer on the gate electrode and the gate insulation layer, subjecting the interlayer dielectric layer and the gate insulation layer to patterning treatment to form, in the interlayer dielectric layer and the gate insulation layer, a source contact hole and a drain contact hole that respectively correspond to the source contact zone and the drain contact zone of the active layer; and forming a source electrode and a drain electrode on the interlayer dielectric layer, such that the source electrode and the drain electrode are respectively set in contact with the source contact zone and the drain contact zone of the active layer through the source contact hole and the drain contact hole;

Step S5: forming a planarization layer on the source electrode, the drain electrode, and the interlayer dielectric layer and subjecting the planarization layer to patterning treatment so as to form, in the planarization layer, a first via that is located above and corresponds to the drain electrode; and forming an anode on the planarization layer, such that the anode is set in contact with the drain electrode through the first via;

Step S6: forming a pixel definition layer on the anode and the planarization layer, subjecting the pixel definition layer to patterning treatment to form, in the pixel definition layer, a second via that is located above and corresponds to the anode, and forming an OLED emissive layer in the second via to be disposed on the anode; and Step S7: separating the flexible backing and the rigid carrier board from each other so as to form a flexible AMOLED substrate;

wherein Step S2 comprises:

Step S21: forming a photoresist layer on the poly-silicon layer; and providing a half-tone mask, wherein the half-tone mask comprises a first area, a second area, and a third area that is an area other than the first area and the second area; and the first area is set to correspond to a location where the active layer is to be formed and the second area is set to correspond to the bending section of the flexible backing;

Step S22: subjecting the photoresist layer to exposure and development with the half-tone mask so that a portion of the photoresist layer that corresponds to the second area of the half-tone mask is completely removed and a portion of the photoresist layer that corresponds to the third area of the half-tone mask 30 is reduced in thickness;

Step S23: subjecting the poly-silicon layer and the buffer layer to etching with the photoresist layer serving as an etch stop layer to so as to remove portions of the poly-silicon layer and the buffer layer that correspond to the bending section of the flexible backing;

Step S24: subjecting the photoresist layer to ashing treatment, so as to have the portion of the photoresist layer that corresponds to the third area of the half-tone mask completely removed and the portion of the photoresist layer that corresponds to the first area of the half-tone mask reduced in thickness;

Step S25: subjecting the poly-silicon layer to etching with the photoresist layer serving as an etch stop layer so as to form the active layer; and Step S26: peeling a remaining portion of the photoresist layer from the active layer; and wherein the buffer layer has a thickness of 0.3-0.5 µm; the gate insulation layer has a thickness of 0.05-0.15 µm; the interlayer dielectric layer has a thickness of 0.15-0.25 µm.

9. The method for manufacturing a flexible AMOLED substrate according to claim 8, wherein in Step S21, the photoresist layer is formed of a material that is a positive photoresist material and the second area has a light transmission rate that is greater than a light transmission rate of the third area and the light transmission rate of the third area is greater than a light transmission rate of the first area.

10. The method for manufacturing a flexible AMOLED substrate according to claim 8, wherein in Step S21, the photoresist layer is formed of a material that is a negative photoresist material and the first area has a light transmission rate that is greater than a light transmission rate of the third area and the light transmission rate of the third area is greater than a light transmission rate of the second area.

* * * * *